United States Patent
Katagiri et al.

(10) Patent No.: US 7,030,379 B2
(45) Date of Patent: Apr. 18, 2006

(54) METHODS FOR DETECTING PHOTONS, RADIATIONS OR NEUTRONS USING SUPERCONDUCTORS AND METHODS FOR OBTAINING TWO-DIMENSIONAL IMAGES THEREOF

(75) Inventors: Masaki Katagiri, Ibaraki (JP); Masataka Ohkubo, Ibaraki (JP)

(73) Assignee: Japan Atomic Energy Research Institute, Tokyo (JP)

( * ) Notice: Subject to any disclaimer, the term of this patent is extended or adjusted under 35 U.S.C. 154(b) by 0 days.

(21) Appl. No.: 11/013,433

(22) Filed: Dec. 17, 2004

(65) Prior Publication Data
US 2005/0205786 A1 Sep. 22, 2005

Related U.S. Application Data

(63) Continuation of application No. 10/180,112, filed on Jun. 27, 2002, now Pat. No. 6,849,850.

(30) Foreign Application Priority Data
Jun. 27, 2001 (JP) ............................. 2001-195150

(51) Int. Cl.
*H01L 39/00* (2006.01)
(52) U.S. Cl. ................. 250/336.2; 250/390.01
(58) Field of Classification Search ............. 250/336.2, 250/390.01
See application file for complete search history.

(56) References Cited

U.S. PATENT DOCUMENTS

| 4,970,395 | A | 11/1990 | Kruse, Jr. |
| 4,978,853 | A | 12/1990 | Hilal |
| 5,097,128 | A | 3/1992 | Jack |
| 5,321,276 | A | 6/1994 | Kurakado et al. |
| 5,347,143 | A | 9/1994 | Schroder |
| 5,710,437 | A * | 1/1998 | Kurakado et al. ............ 257/32 |
| 5,880,468 | A | 3/1999 | Irwin et al. |
| 6,281,497 | B1 | 8/2001 | Suzuki |
| 2003/0178567 | A1 | 9/2003 | Goldie |

OTHER PUBLICATIONS

H. Kraus, et al., "Quasiparticle Trapping in a Supeconductive Detector System Exhibiting High Energy and Position Resolution", Nov. 1989, pp. 195-202, vol. 231 No. 1,2, Elsevier Science Publishers B.V.

M. Kurakado, et al., "Further development of series-connected superconducting tunnel junction to radiation detection", Oct. 1997, pp. 3685-3696, vol. 68 No. 10, American Institute of Physics.

(Continued)

*Primary Examiner*—Albert Gagliardi
(74) *Attorney, Agent, or Firm*—Banner & Witcoff, Ltd.

(57) ABSTRACT

In the improved neutron image detector, $MgB_2$ enriched in a constituent element $^{10}B$ of wide energy gap is used as a neutron detection plate, which is provided at the center and the four corners with a phonon sensor comprising an insulation layer overlaid with $Mg^{11}B_2$ enriched in $^{11}B$ of narrow energy gap in order to detect phonons resulting from the generation of α-rays which occurs in the detection plate upon incidence of neutrons, and sensor's signal intensity and signal propagation time are used to detect the incident position of neutrons.

22 Claims, 12 Drawing Sheets

OTHER PUBLICATIONS

R. den Hartog, et al., "An X-ray photon-counting imaging spectrometer based on a Ta absorber with four superconducting tunnel junctions", pp. 278-282, 2000 Elsevier Science B.V.

C. van Eijk, "Neutron PSDs for the next generation of spallation neutron sources", pp. 383-390, 2002 Elsevier Science B.V.

M. Kurakado et al. "Series-Connected STJ Detector Wtih Large Sensitive Area", pp. 76-97.

Th. Peterreins, et al., "Phonon Mediated Position Resolved Detection of a Particles With Superconducting Tunnel Junctions", Feb. 1988, pp. 70-72, vol. 35, No. 1, IEEE Transactions on Nuclear Science.

H. Pressler, et al. "Factors of Inhomogeneous Spatial Response of Superconducting Tunnel Junction Detectors", pp. 19-22, 2002 American Institute of Physics.

S. Kamihirata, et al., "Two Dimensional Position Resolution and Correction of Incidence Position Dependency of Signal Heights of Series-Junction Detectors", pp. 149-152, 2002 American Institute of Physics.

M. Lisitskii, et al., "Aluminum Superconducting Tunnel Junction as X-Ray Detector. Technological Aspects and Phonon Decoupling from the Substrate", pp. 157-160, 2002 American Institute of Physics.

H. Sato, et al., "Development of Superconducting Tunnel Junctions as Energy-dispersive Detectors for EUV Radiation", pp.165-168, 2002 American Institute of Physics.

M. Katagiri, et al., "High Count Rate X-ray Detector Using a Superconducting Tunnel Junction with Current Readout Method", pp. 177-180, 2002 American Institute of Physics.

* cited by examiner

METHODS FOR DETECTING PHOTONS, RADIATIONS OR NEUTRONS USING SUPERCONDUCTORS AND METHODS FOR OBTAINING TWO-DIMENSIONAL IMAGES THEREOF

This application claims the benefit under 35 U.S.C. § 120 and 119(a) as a continuation of prior filed U.S. application Ser. No. 10/180,112, filed Jun. 27, 2002, now U.S. Pat. No. 6,849,850, the entirety of which is hereby incorporated by reference, and foreign priority of Japan application no. 195150/2001 filed Jun. 27, 2001.

BACKGROUND OF THE INVENTION

This invention relates to methods for detecting photons, radiations or neutrons using superconductors and methods for obtaining two-dimensional images thereof. The invention is particularly characterized by using $MgB_2$ as a superconductor having isotopes that become adequately superconducting at the temperature of liquid helium. The invention also realizes imaging with high position resolution by using a two-dimensional imaging method that detects phonons with a superconductor sensor as they are generated from a superconducting or single-crystal detection medium. The invention is therefore applicable to the fabrication of sensors for use in experiments or analyses with photons shorter than a few microns, X-rays or neutrons. It also finds utility in analytical techniques that take advantage of its ability to detect both the incident energy and position of photons, radiations or neutrons.

An X-ray detector of high energy resolution using a $Nb/Al/Al_2O_3/Al/Nb$ tunnel junction device has been developed by Matsumura et al. (Matsumura et al., Nucl. Instrum. & Methods, A329 (1993) 227) and other researchers and used as a superconductor-based radiation detector. An imaging detector for detecting the incident energy and position of a radiation with the intermediary of phonons generated from a superconducting or single-crystal radiation detection medium has been developed by Kurakado et al. (Kurakado et al., Rev. Sci. Instrum. 62 (1991) 156) and other researchers.

In the contemplated prior art technology, Nb has been used as a superconductor; particularly, in the case of detectors using a superconducting tunnel junction, it was necessary to cool them to a temperature about a tenth of the critical temperature before use but cooling to about 0.4 K was time-consuming and required an expensive apparatus. It has therefore been desired to develop a superconducting detector that can be operated at higher temperatures. In addition, neutron imaging detectors were scanty that used superconductors. What is more, it has been very difficult to develop an imaging detector capable of detecting X-rays or neutrons at high position resolution.

SUMMARY OF THE INVENTION

The invention provides a superconducting detector device that uses $MgB_2$ with a critical temperature above 30 K which has isotopes $^{10}B$ and $^{11}B$ with different energy gaps. The device has an incomparable detecting function and can be operated at the temperature of liquid helium. If $MgB_2$ is enriched in $^{10}B$ rather than $^{11}B$, a neutron detector and a neutron imaging detector can be constructed.

DESCRIPTION OF THE PREFERRED EMBODIMENTS

EXAMPLE 1

Figure 1:
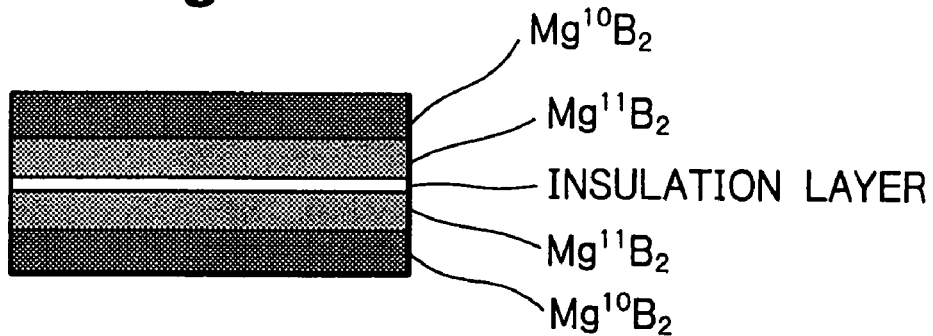
FIG. 1 is a photon and radiation detector using a superconductor tunnel junction device that operates on an isotope effect for providing two superconductors with different energy gaps.

The first example of the invention as it relates to a photon, radiation and neutron detector is described below with reference to FIG. 1. In this example, $MgB_2$ is used as a superconductor having a higher critical temperature than conventional superconductors such as Nb. The superconductor $MgB_2$ can be prepared in two forms enriched in $^{10}B$ and $^{11}B$, respectively. The isotope effect realizes two superconductors $^{10}B$ and $^{11}B$ having different energy gaps. This effect was used to fabricate a five-layered superconducting tunnel junction device comprising in the order written an isotopic superconductor $Mg^{10}B_2$ of wide energy gap, an isotopic superconductor $Mg^{11}B_2$ of narrow energy gap, an insulation layer, an isotopic superconductor $Mg^{11}B_2$ of narrow energy gap and an isotopic superconductor $Mg^{10}B_2$ of wide energy gap. The $Mg^{10}B_2$ layers were each about 500 nm thick and the $Mg^{11}B_2$ layers were each about 50 nm thick. The insulation layer was about 2 nm thick. The isotopic superconductor $Mg^{11}B_2$ of narrow energy gap formed a quasiparticle trapping layer which trapped the quasiparticles generated from the isotopic superconductor $Mg^{10}B_2$ of wide energy gap and this enabled efficient detection of photons or radiations. Since the superconductor layer working as the detection medium and the trapping layer were made of isotopic superconductors, they were easier to make than the conventional Nb/Al layer and their continuity assured more efficient device operation. The design of Example 1 allowed for fabrication of a radiation detector capable of measuring the energy of radiations.

EXAMPLE 2

Figure 2:
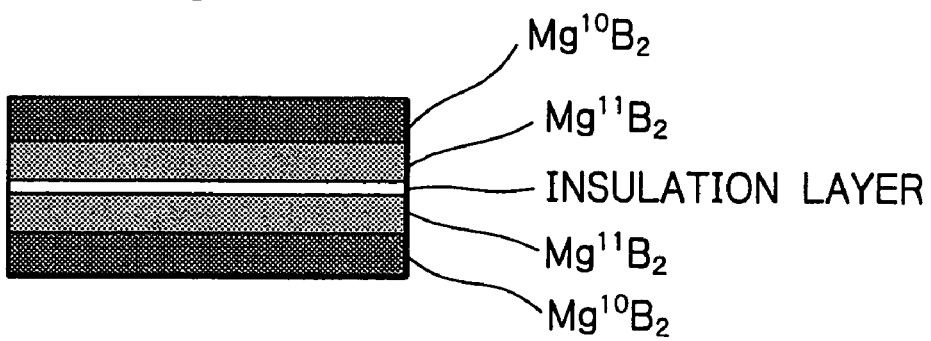
FIG. 2 is a neutron detector using a superconductor tunnel junction device which operates on the isotope effect of $MgB_2$ containing boron as a neutron converter in order to provide two superconductors with different energy gaps.

The second example of the invention as it relates to a neutron detector is described below with reference to FIG. 2. Example 2 is identical to Example 1 except for the use of an isotopic superconductor $Mg^{10}B_2$ containing the neutron converter boron ($^{10}B$) as a constituent element. By using the isotopic superconductor $Mg^{10}B_2$ to detect the α-rays emitted from $^{10}B$ having a large neutron absorption cross-sectional area, we could fabricate a neutron detector using a superconducting tunnel junction device to be capable of efficient neutron detection.

EXAMPLE 3

Figure 3:
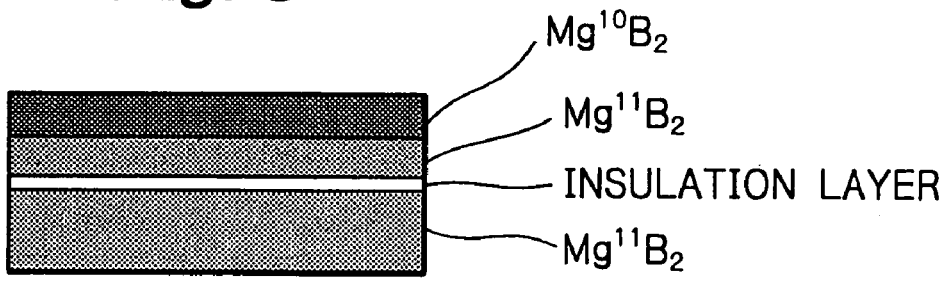
FIG. 3 is a neutron detector having neutron sensitivity only on one side and using a superconductor tunnel junction device which operates on the isotope effect of $MgB_2$ containing boron as a neutron converter in order to provide two superconductors having different energy gaps.

The third example of the invention as it relates to a neutron detector is described below with reference to FIG. 3. In this example, an isotopic superconductor $Mg^{10}B_2$ containing boron (B) as a constituent element was used to fabricate a four-layered superconducting tunnel junction device comprising in the order written an isotopic superconductor $Mg^{10}B_2$ of wide energy gap, an isotopic superconductor $Mg^{11}B_2$ of narrow energy gap, an insulation layer and an isotopic superconductor $Mg^{11}B_2$ of narrow energy gap. $Mg^{11}B_2$ formed a quasiparticle trapping layer. Since the $Mg^{11}B_2$ on one side rendered insensitivity to neutrons, the neutron detector of Example 3 was sensitive to neutrons only on the other side. The individual layers of the detector had the same thicknesses as in Example 1.

EXAMPLE 4

Figure 4:
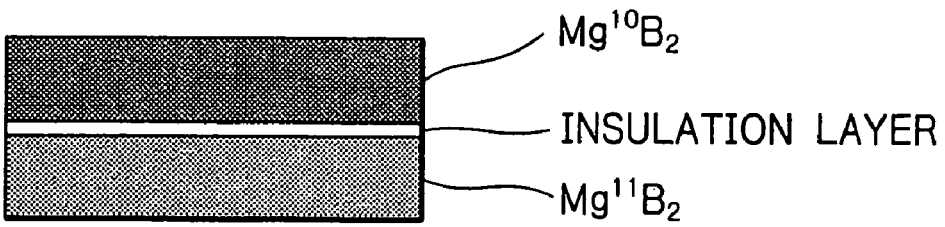
FIG. 4 is a three-layered neutron detector having neutron sensitivity only on one side and using a superconductor tunnel junction device which operates on the isotope effect of $MgB_2$ containing boron as a neutron converter in order to provide two superconductors with different energy gaps.

The fourth example of the invention as it relates to a neutron detector is described below with reference to FIG. 4. In this example, an isotopic superconductor $Mg^{10}B_2$ containing boron (B) as a constituent element was used to fabricate a three-layered superconducting tunnel junction device comprising in the order written an isotopic superconductor $Mg^{10}B_2$ of wide energy gap, an insulation layer and an isotopic superconductor $Mg^{11}B_2$ of narrow energy gap. Since the $Mg^{11}B_2$ on one side rendered insensitivity to neutrons, the neutron detector of Example 3 was sensitive to neutrons only on the other side. The individual layers of the detector had the same thicknesses as in Example 1.

EXAMPLE 5

Figure 5:
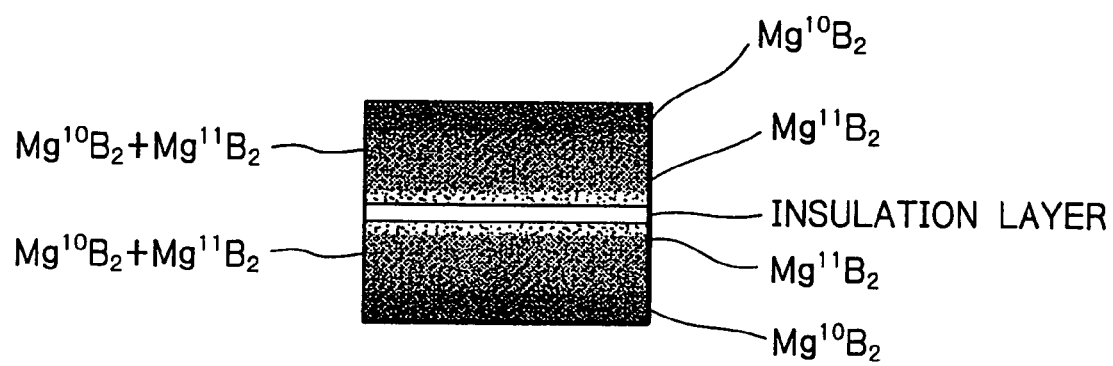
FIG. 5 is a photon, radiation and neutron detector using a superconductor tunnel junction device which incorporates a gradient superconductor with a gradual compositional transition in the direction of thickness from a superconductor enriched in $^{10}B$ of wide energy gap to a superconductor enriched in $^{11}B$ of narrow energy gap.

The fifth example of the invention as it relates to a photon, X-ray and neutron detector is described below with reference to FIG. 5. In this example, an isotopic superconductor $MgB_2$ containing boron (B) as a constituent element has the isotope effect which realizes two superconductors having different energy gaps. This effect was used to fabricate a three-layered superconducting tunnel junction device comprising in the order written an $Mg^{10}B_2/Mg^{11}B_2$ gradient superconductor with a gradual compositional transition in the direction of thickness from a superconductor enriched in $^{10}B$ of the wider energy gap to a superconductor enriched in $^{11}B$ of the narrower energy gap, an insulation layer and an $Mg^{10}B_2/Mg^{11}B_2$ gradient superconductor with a gradual compositional transition in the direction of thickness from a superconductor enriched in $^{10}B$ of the wider energy gap to a superconductor $^{11}B$ of the narrower energy gap. The two gradient superconductor layers were each about 500 nm thick and the insulation layer was about 2 nm thick. The quasiparticles generated in each gradient superconductor would migrate to the isotopic superconductor of the narrower energy gap, thereby allowing for efficient detection of photons, radiations or neutrons by the superconducting tunnel junction.

EXAMPLE 6

Figure 6:
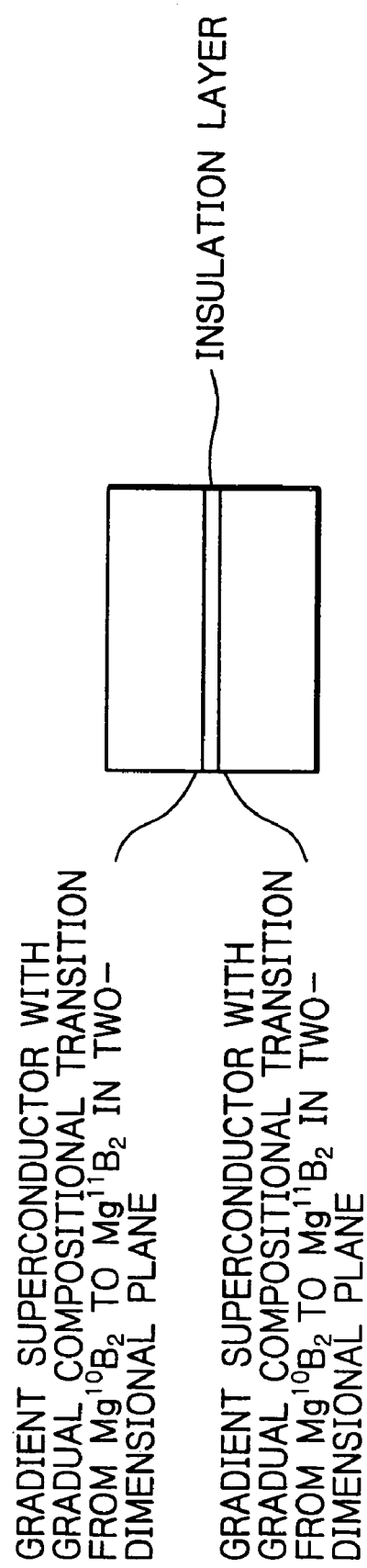
FIG. 6 is a photon, radiation and neutron image detector using a superconductor tunnel junction device which incorporates as a detection medium a gradient superconductor with a gradual compositional transition in a two-dimensional plane from a superconductor enriched in $^{10}B$ of wide energy gap to a superconductor enriched in $^{11}B$ of narrow energy gap.

The sixth example of the invention as it relates to a neutron image sensor is described below with reference to FIG. 6. In this example, an isotopic superconductor $MgB_2$ containing boron (B) as a constituent element has the isotope effect which realizes two superconductors having different energy gaps. This effect was used to fabricate a three-layered superconducting tunnel junction device comprising in the order written an $Mg^{10}B_2/Mg^{11}B_2$ gradient superconductor with a gradual compositional transition in a two-dimensional plane from a superconductor enriched in $^{10}B$ of the wider energy gap to a superconductor enriched in $^{11}B$ of the narrower energy gap, an insulation layer and an $Mg^{10}B_2/Mg^{11}B_2$ gradient superconductor with a gradual compositional transition in a two-dimensional plane from a superconductor enriched in $^{10}B$ of the wider energy gap to a superconductor enriched in $^{11}B$ of the narrower energy gap. The two gradient superconductor layers were each about 500 nm thick and the insulation layer was about 2 nm thick. On account of the $Mg^{10}B_2/Mg^{11}B_2$ gradient superconductor, different energy gaps, hence, varying pulse peaks would be output depending upon the incident position of photons, radiations or neutrons; as a result, photons or radiations incident with specified energy or neutrons emitting a specified energy of α-rays could be detected for their image at high position resolution. This design enables the fabrication of a photon, radiation and neutron image detector using a superconducting tunnel junction device.

EXAMPLE 7

Figure 7:
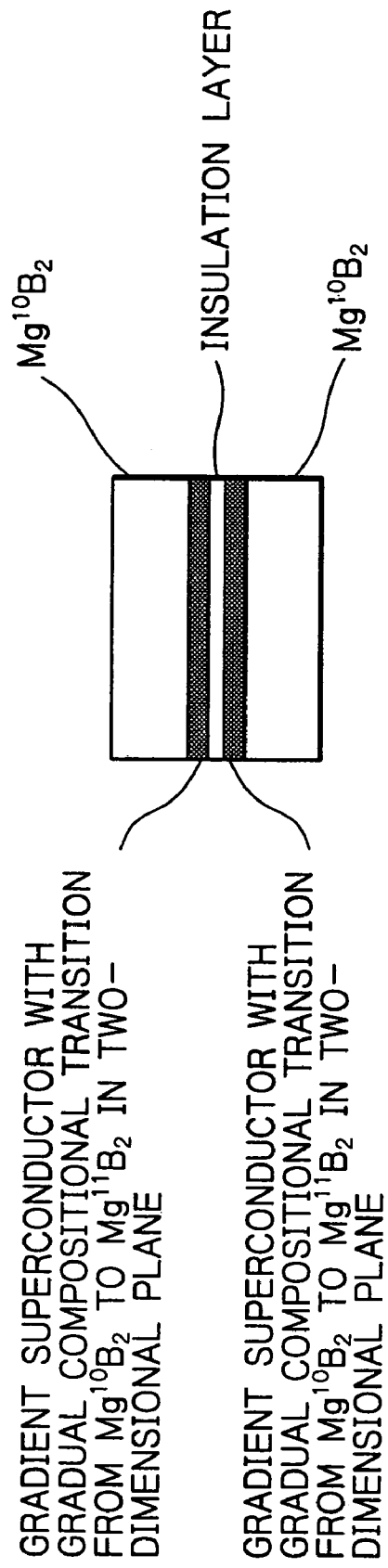
FIG. 7 is a photon, radiation and neutron image detector using a superconductor tunnel junction device which incorporates as a quasiparticle trapping layer a gradient superconductor with a gradual compositional transition in a two-dimensional plane from a superconductor enriched in $^{10}B$ of wide energy gap to a superconductor enriched in $^{11}B$ of narrow energy gap.

The seventh example of the invention as it relates to a neutron image sensor is described below with reference to FIG. 7. In this example, there is fabricated a five-layered superconducting tunnel junction device comprising in the order written an isotopic superconductor $Mg^{10}B_2$ as a detection medium that is enriched in $^{10}B$ of wide energy gap, an $Mg^{10}B_2/Mg^{11}B_2$ gradient superconductor with a gradual compositional transition in a two-dimensional plane from a superconductor enriched in $^{10}B$ of the wider energy gap to a superconductor enriched in $^{11}B$ of the narrower energy gap, an insulation layer, an $Mg^{10}B_2/Mg^{11}B_2$ gradient superconductor with a gradual compositional transition in a two-dimensional plane from a superconductor enriched in $^{10}B$ of the wider energy gap to a superconductor enriched in $^{11}B$ of the narrower energy gap, and the other detection medium made of $Mg^{10}B_2$. The two layers of the isotopic superconductor $Mg^{10}B_2$ enriched in $^{10}B$ of wide energy gap were each 500 nm thick, the gradient superconductor layers were each about 50 nm thick, and the insulation layer was about 2 nm thick. The $Mg^{10}B_2/Mg^{11}B_2$ gradient superconductors worked as quasiparticle trapping layers, so when the quasiparticles generated within $Mg^{10}B_2$ were detected in the superconducting tunnel junction, different energy gaps, hence, varying pulse peaks would be outputted depending upon the incident position of photons, radiations or neutrons; as a result, photons or radiations incident with specified energy or neutrons emitting a specified energy of α-rays could be detected for their image at high position resolution. This design again enables the fabrication of a photon, radiation or neutron image detector using a superconducting tunnel junction device.

EXAMPLE 8

Figure 8:
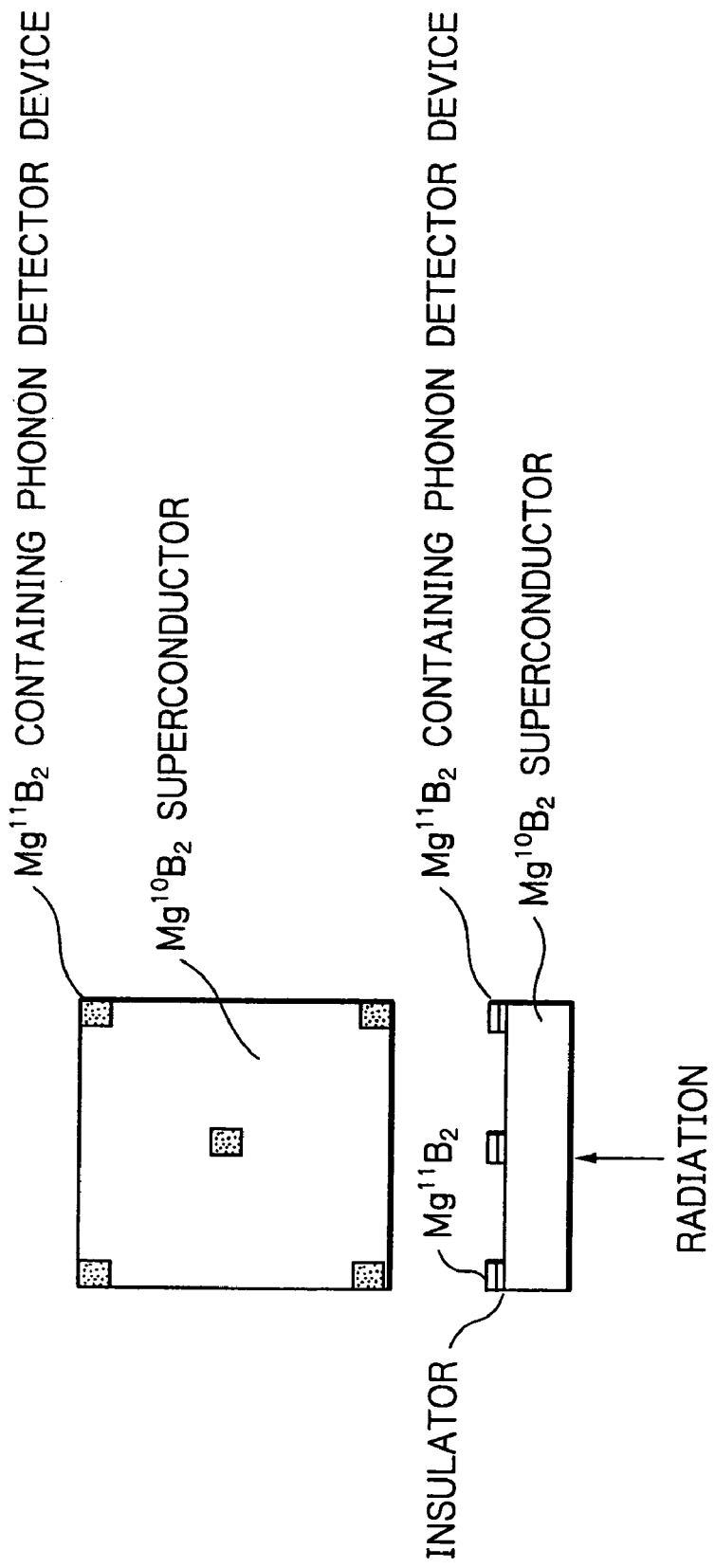
FIG. 8 is a radiation image detector using a superconducting tunnel junction device to detect the incident position of photons or radiations with the intermediary of phonons generated from an isotopic superconductor of wide energy gap as a detection plate.

The eighth example of the invention as it relates to a radiation image detector is described below with reference to FIG. 8. The isotopic superconductor $Mg^{10}B_2$ enriched in $^{10}B$ of wide energy gap has a different energy gap than the isotopic superconductor $Mg^{11}B_2$ enriched in $^{11}B$ of narrow energy gap. To take advantage of this effect, the isotopic superconductor $Mg^{10}B_2$ of wide energy gap was used as a detection plate which was provided with a phonon sensor at the center and the four corners in order to detect phonons generated in the plate which it was illuminated with a radiation. The phonon sensor had a two-layered structure consisting of an insulation layer overlaid with the isotopic superconductor $Mg^{11}B_2$ enriched in $^{11}B$ of narrow energy gap. Both the intensity and the propagation time of signals from the phonon sensors were both used to detect the incident position of a radiation. The detection plate made of the isotopic superconductor $Mg^{10}B_2$ measured 2 $mm^L \times 2$ $mm^W \times 0.2$ $mm^T$; the $Mg^{11}B_2$ layer was 50 nm thick and the insulation layer was 2 nm thick. This design enables the fabrication of a radiation image detector using a superconducting tunnel junction device. The energy of an incident radiation could be measured by analyzing the output signal from each phonon sensor.

EXAMPLE 9

Figure 9:
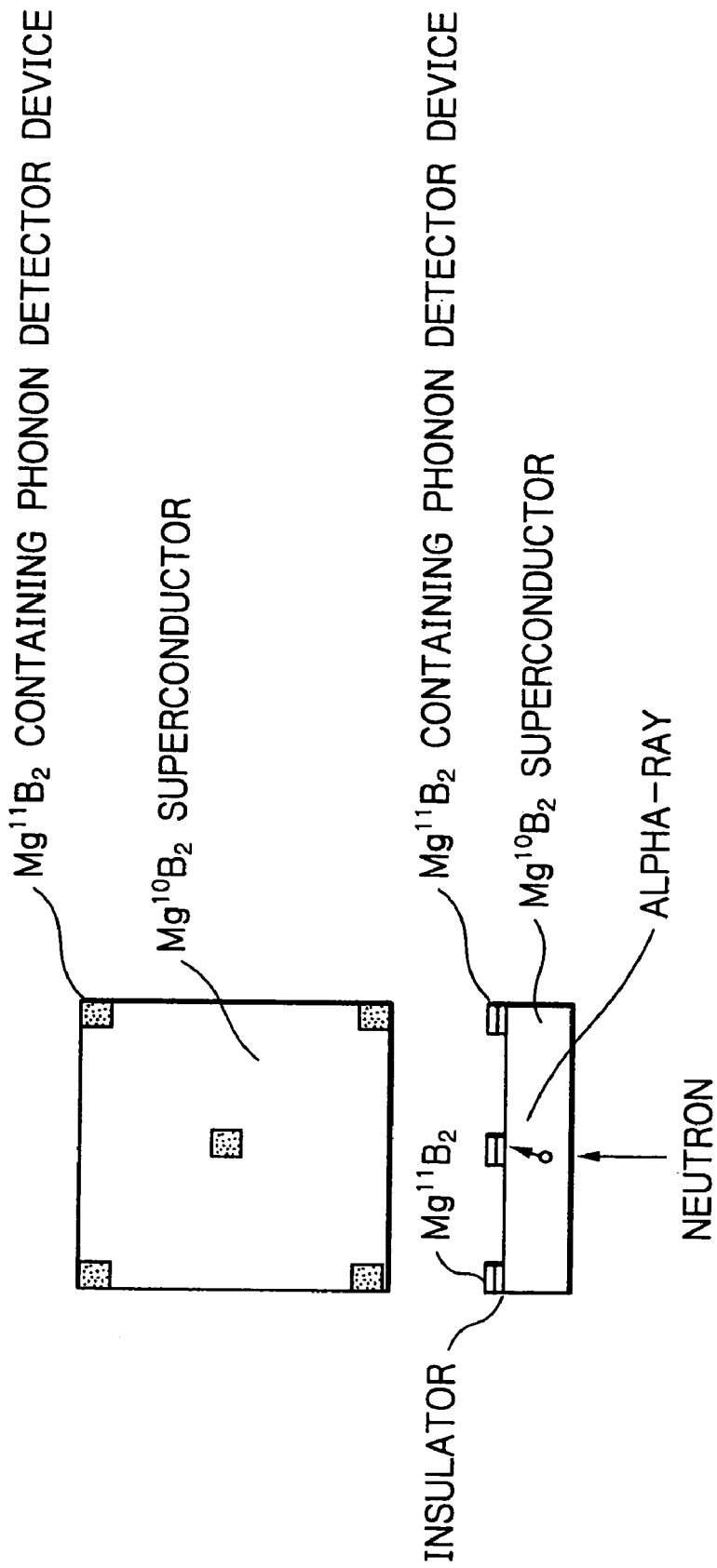
FIG. 9 is a neutron image detector using a superconducting tunnel junction device to detect the incident position of neutrons with the intermediary of phonons generated from a $^{10}B$ enriched isotopic superconductor as a neutron detection plate.

The ninth example of the invention as it relates to a neutron image detector is described below with reference to FIG. 9. This example is identical to Example 8. Since the isotopic superconductor $Mg^{10}B_2$ containing the neutron converter boron ($^{10}B$) as a constituent element is used as the neutron detection plate, α-particles emitted from $^{10}B$ having a large neutron cross-sectional area are detected in the isotopic superconductor $Mg^{10}B_2$ layer formed in a thickness of 0.2 mm and efficient neutron detection can be accomplished by the neutron image detector of Example 9.

EXAMPLE 10

Figure 10:
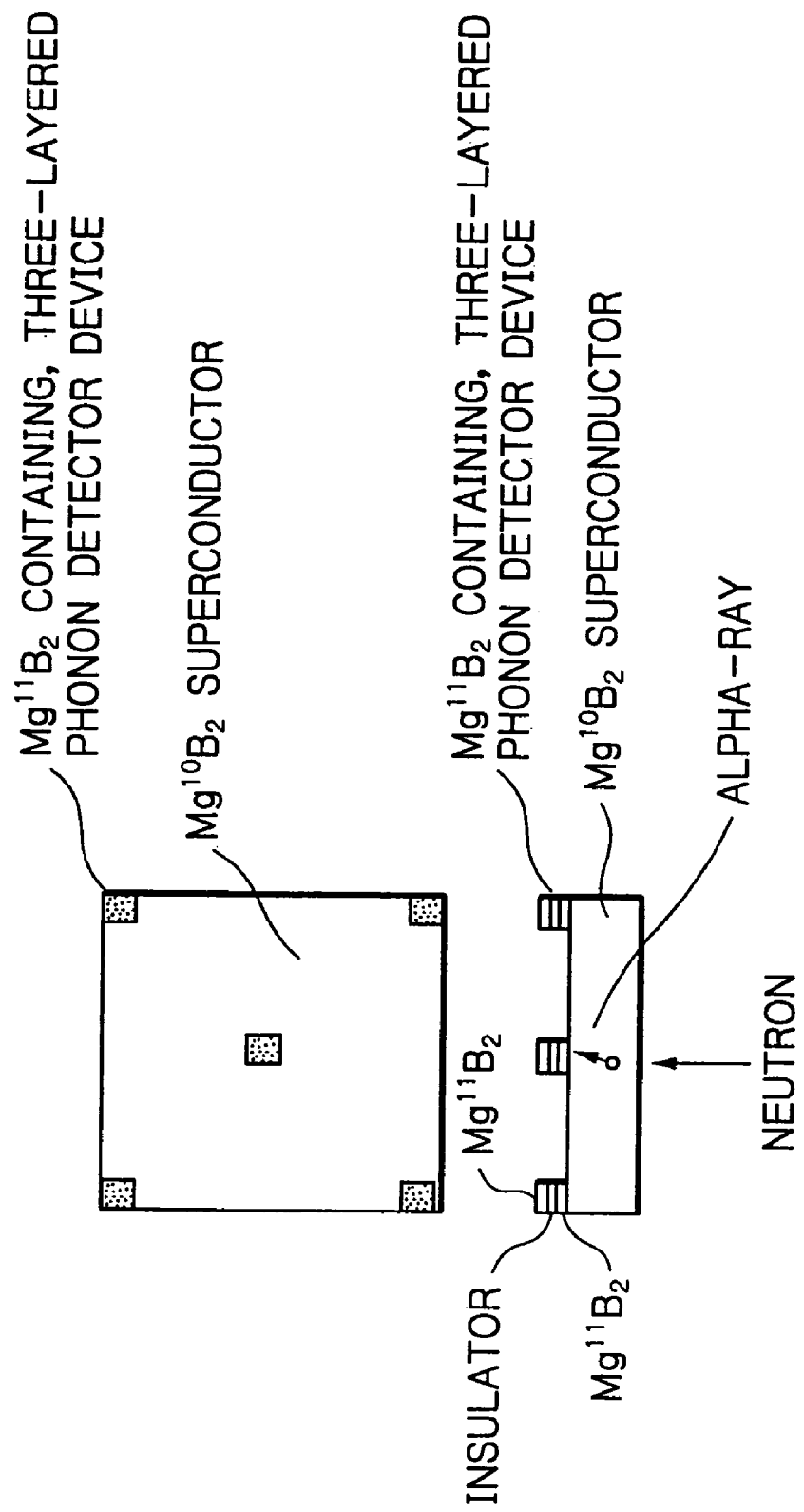
FIG. 10 is a neutron image detector using a superconducting tunnel junction device to detect the incident position of neutrons by means of a three-layered superconducting sensor with the intermediary of phonons generated from a $^{10}B$ enriched isotopic superconductor as a neutron detection plate.

The tenth example of the invention as it relates to a neutron image detector is described below with reference to FIG. 10. This example is identical to Example 9, except that the phonon sensor has a three-layered structure consisting of the isotopic superconductor $Mg^{11}B_2$ enriched in $^{11}B$ of narrow energy gap, an insulation layer and the isotopic superconductor $Mg^{11}B_2$ enriched in $^{11}B$ of narrow energy gap. The phonon sensor having this configuration is capable of producing higher signal outputs than in Example 8 and, hence, the neutron image detector of Example 9 has even better sensitivity than that of Example 8. The above-described design enables the fabrication of a neutron image detector using a superconducting tunnel junction device.

EXAMPLE 11

Figure 11:
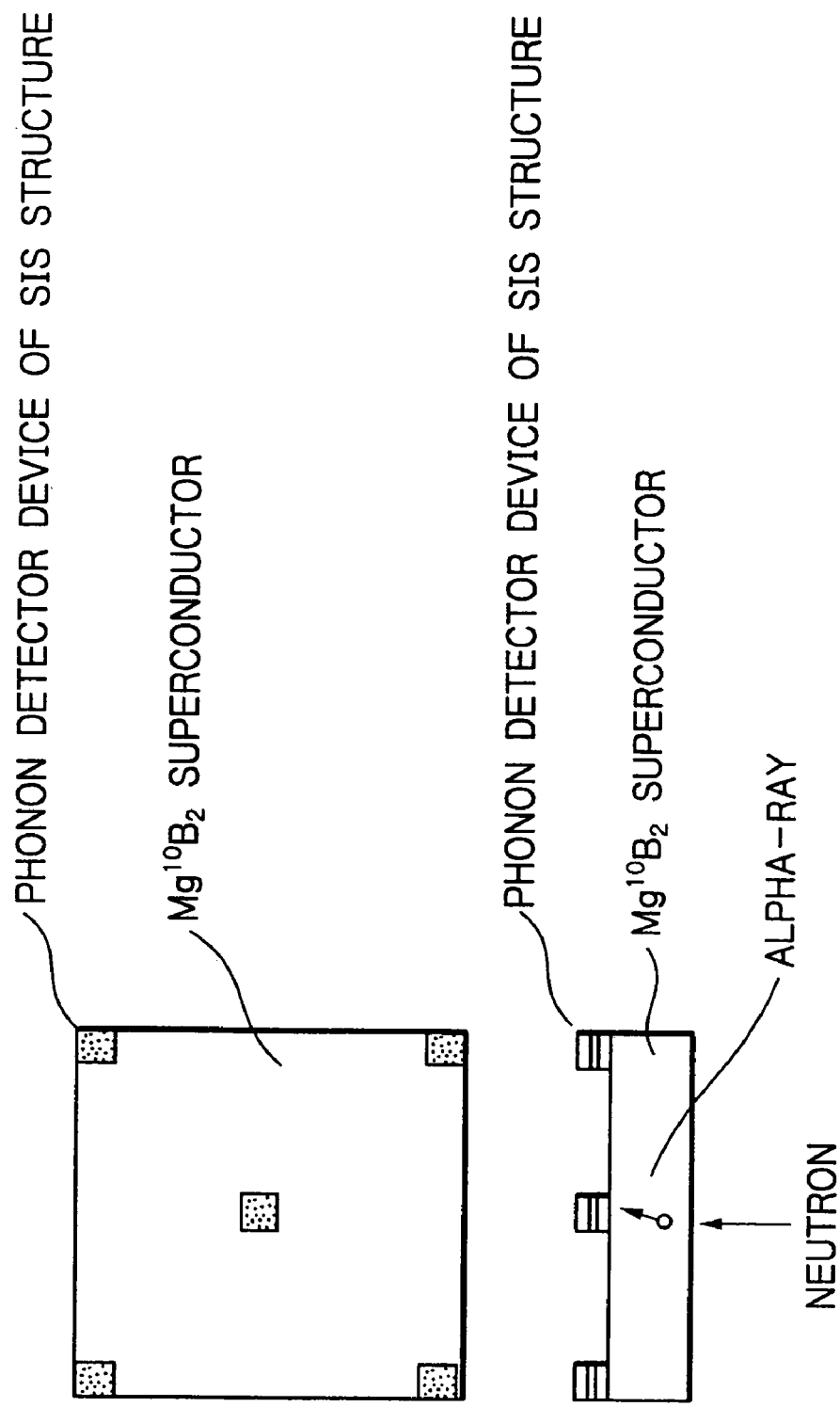
FIG. 11 is a neutron image detector using a superconducting tunnel junction device to detect the incident position of neutrons by means of a superconducting sensor of an SIS structure with the intermediary of phonons generated from a $^{10}B$ enriched isotopic superconductor as a neutron detection plate.

The eleventh example of the invention as it relates to a neutron image detector is described below with reference to FIG. 11. This example is identical to Example 9, except that the phonon sensor has an SIS structure consisting of a superconductor (S), an insulator (I) and a superconductor (S). The SIS structure may be a Nb/Al/Al$_2$O$_3$/Al/Nb structure. The phonon sensor having this configuration has a narrower energy gap and, hence, is capable of producing higher signal outputs than in Example 8, provided that it operates at 0.4 K and below. The above-described design enables the fabrication of a neutron image detector using a superconducting tunnel junction device.

EXAMPLE 12

Figure 12:
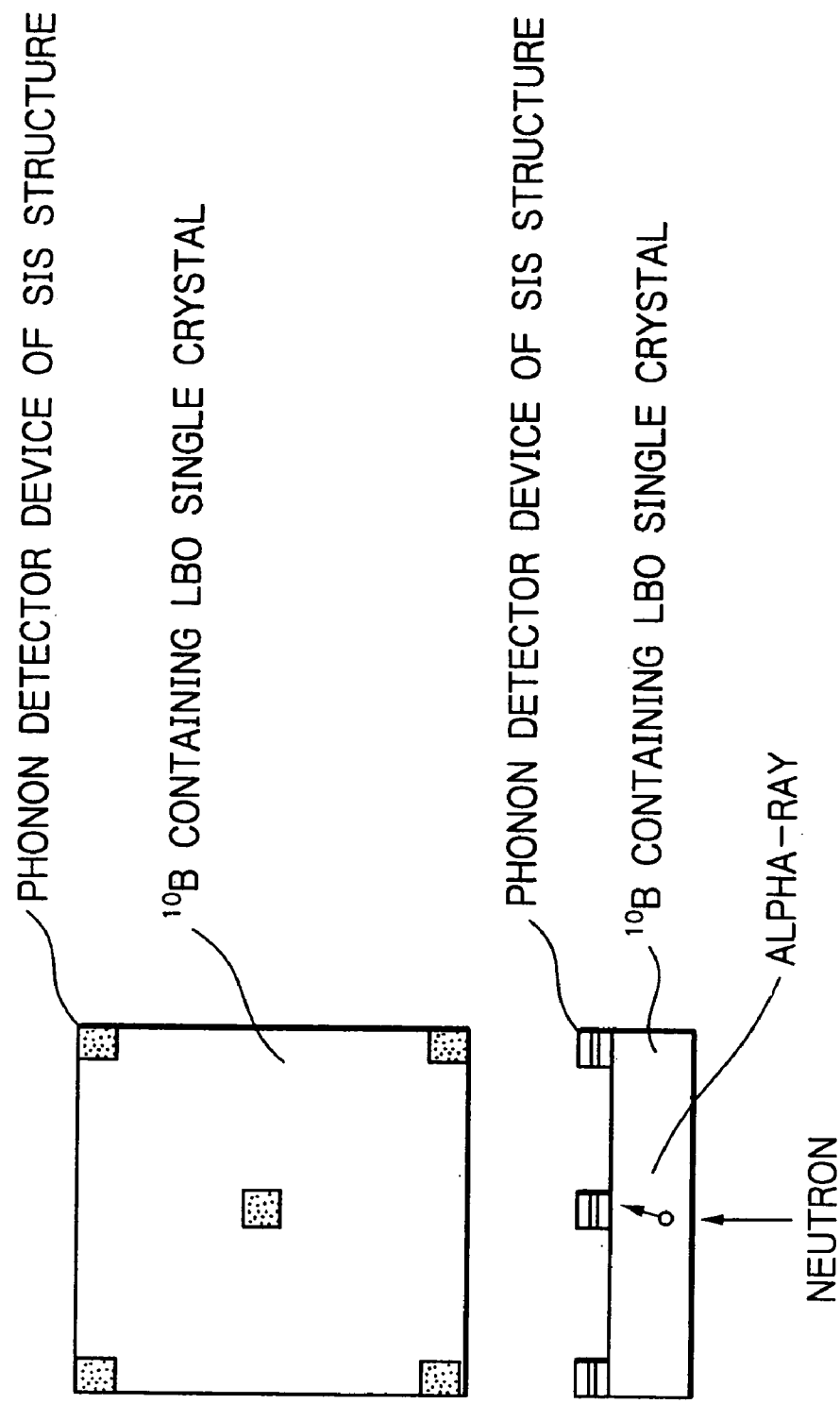
FIG. 12 is a neutron image detector using a superconducting tunnel junction device to detect the incident position of neutrons by means of a superconducting sensor of an SIS structure with the intermediary of phonons generated from a $^{10}B$ containing single LBO crystal as a neutron detection plate.

The twelfth example of the invention as it relates to a neutron image detector is described below with reference to FIG. 12. In this example, a $^{10}B$ containing single-crystal LBO mass (LiB$_3$O$_5$ or Li$_2$B$_4$O$_7$) is used as a neutron detection plate. In order to detect phonons generated when it is illuminated with neutrons, the detection plate is provided with a phonon sensor having a Nb/Al/Al$_2$O$_3$/Al/Nb structure as an SIS structure. This phonon sensor is provided at the center and the four corners of the detection plate and uses the intensity and the propagation time of output signals to detect the incident position of neutrons. The above-described design enables the fabrication of a neutron image detector using a superconducting tunnel junction device.

EXAMPLE 13

Figure 13:
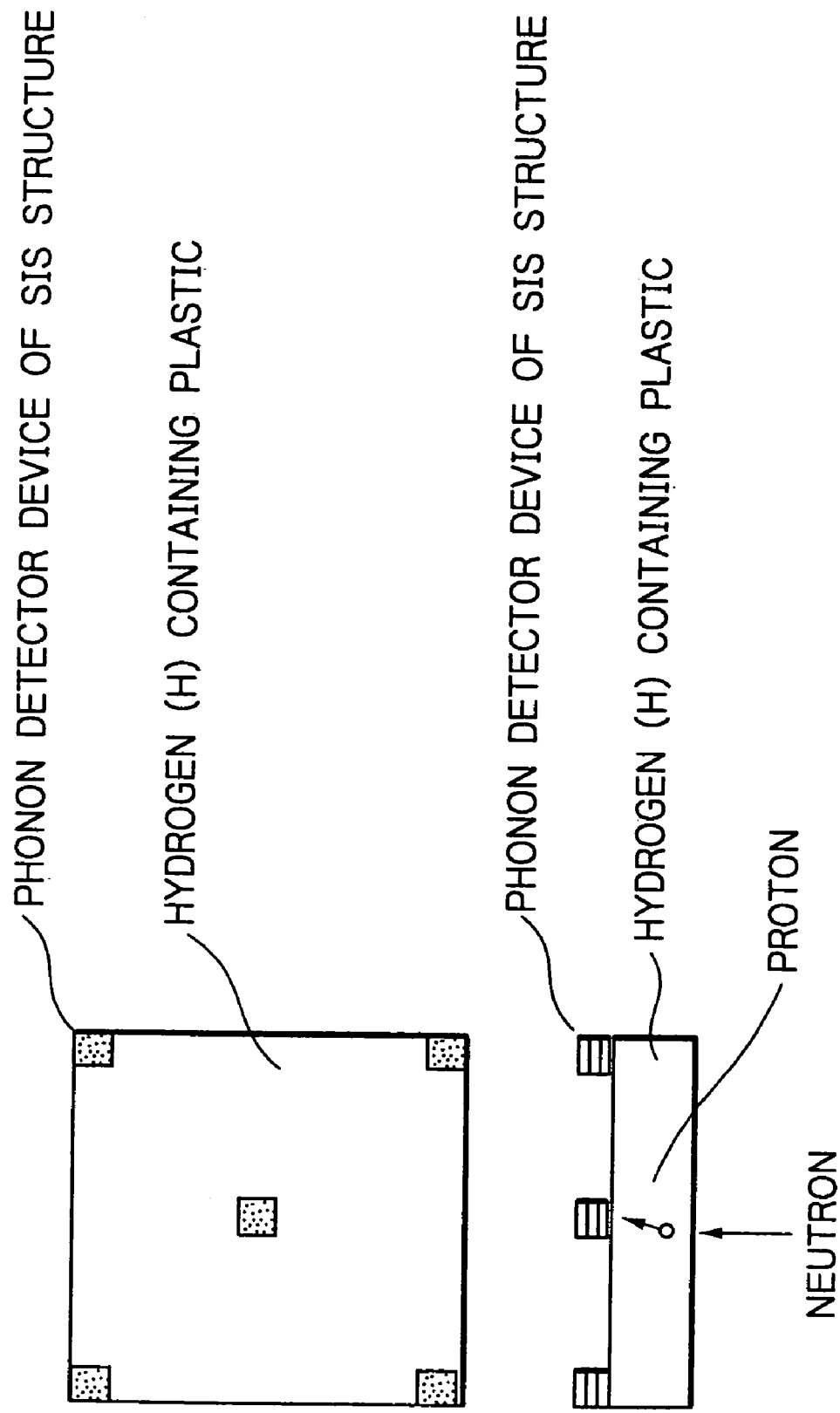
FIG. 13 is a fast neutron image detector using a superconducting tunnel junction device to detect the incident position of neutrons by means of a superconducting sensor of an SIS structure with the intermediary of phonons generated from a hydrogen (H) containing plastic material as a fast neutron detection plate.

The thirteenth example of the invention as it relates to a fast neutron image detector is described below with reference to FIG. 13. In this example, a hydrogen (H) containing plastic material is used as a fast neutron detection plate. In order to detect phonons due to the generation of protons (p) in the (n,p) reaction which occurs when it is illuminated with neutrons, the detection plate is provided with a phonon sensor having a Nb/Al/Al$_2$O$_3$/Al/Nb structure as an SIS structure. This phonon sensor is provided at the center and the four corners of the detection plate and uses the intensity and the propagation time of output signals to detect the incident position of fast neutrons. The hydrogen (H) containing plastic detection plate measures 2 mm$^L$×2 mm$^W$×0.2 mm$^T$.

The above-described design enables the fabrication of a fast neutron image detector using a superconducting tunnel junction device.

EXAMPLE 14

Figure 14:
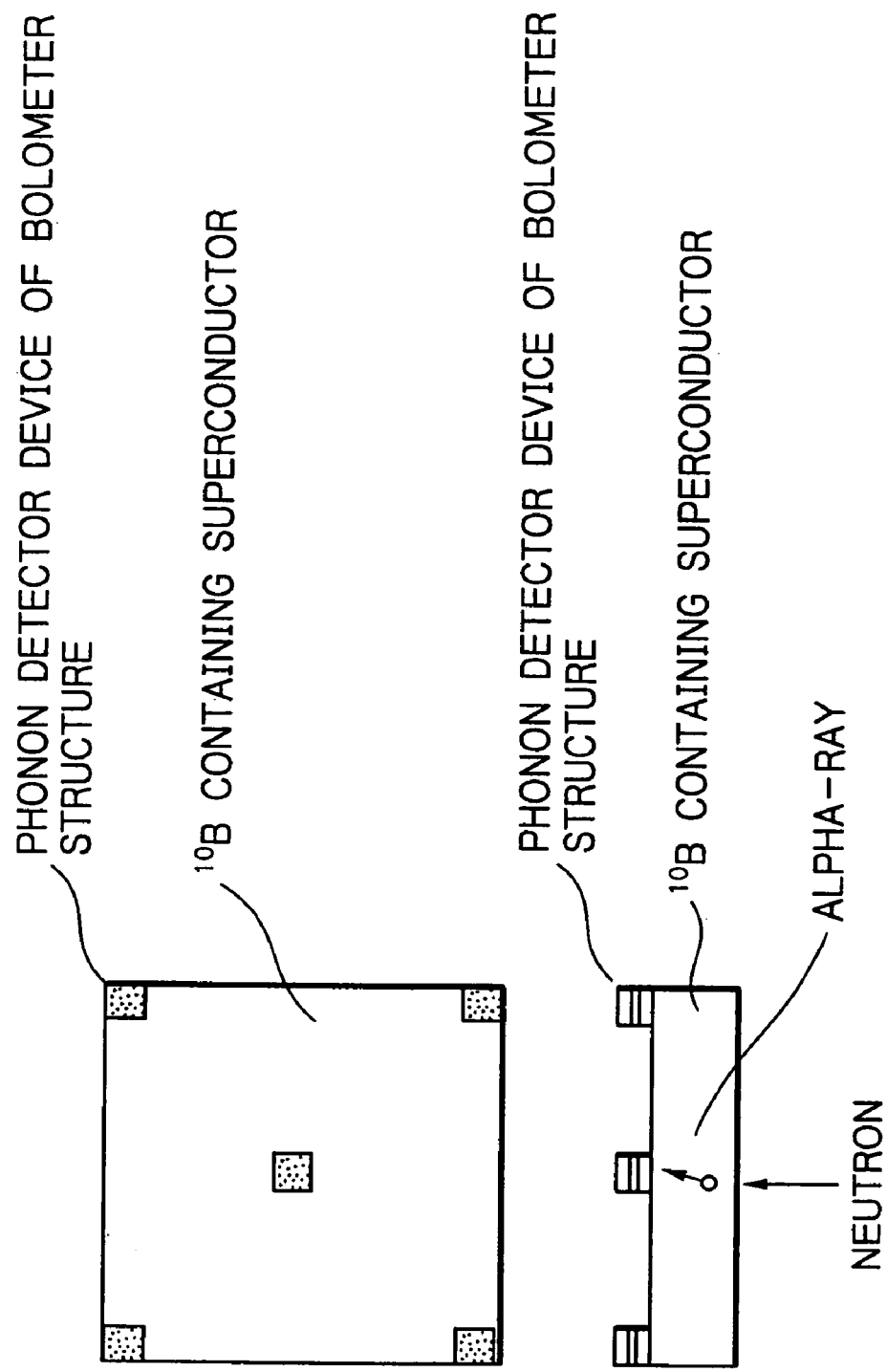
FIG. 14 is a neutron image detector using a superconducting tunnel junction device to detect the incident position of neutrons by means of a phonon detector device of a bolometer structure with the intermediary of phonons generated from a $^{10}B$ enriched isotopic superconductor as a neutron detection plate.

The fourteenth example of the invention as it relates to a 2D neutron image detector is described below with reference to FIG. 14. This example is the same as Example 9, except that a bolometer device is used as the phonon sensor. The bolometer device is a neutron-producing nuclear transmutation Ge bolometer. The device is a sensor capable of highly sensitive detection of temperature elevations due to phonon signals through measurement of changes in resistance. The above-described design enables the fabrication of a neutron image detector using a superconducting tunnel junction device.

EXAMPLE 15

Figure 15:
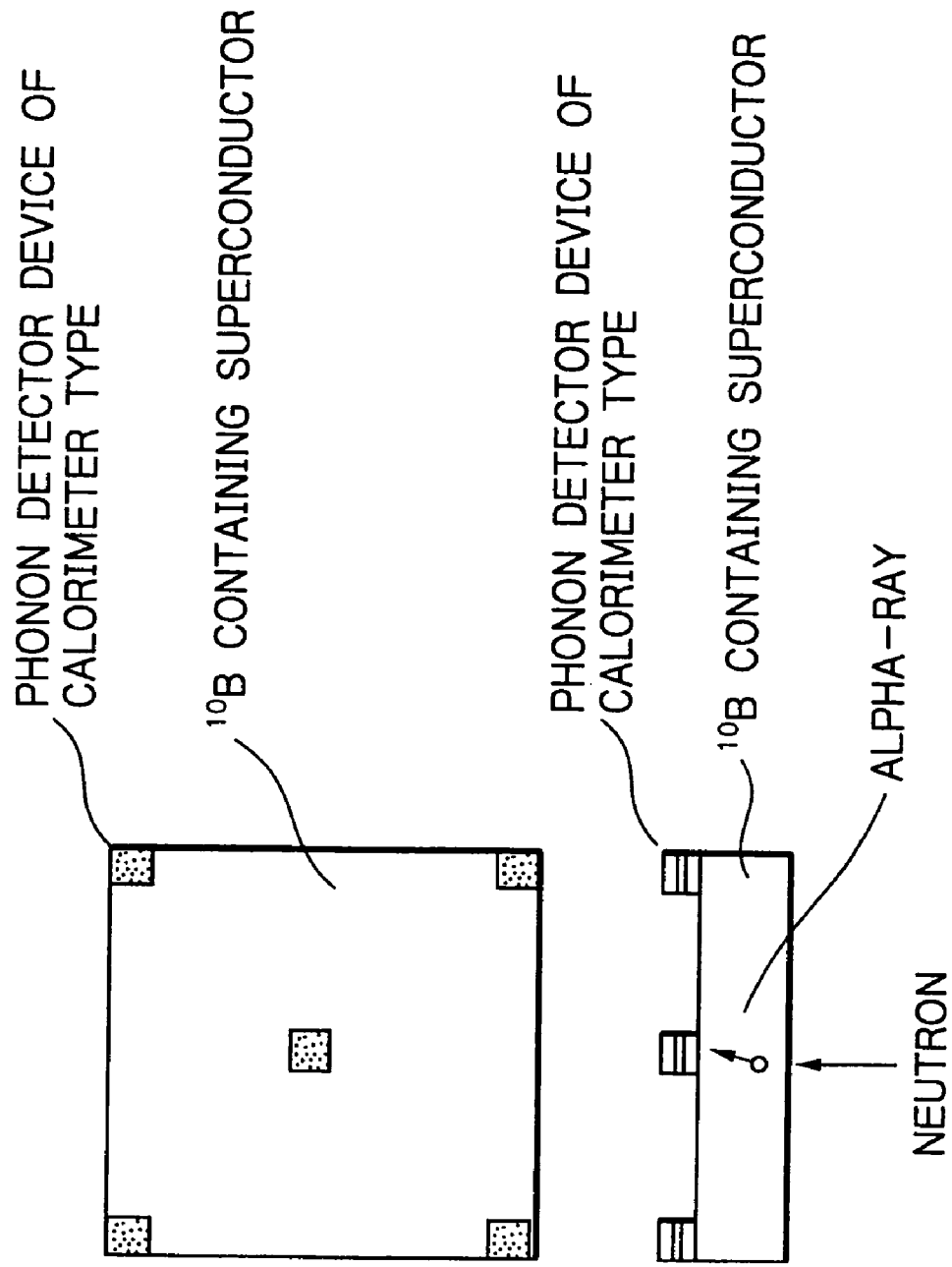
FIG. 15 is a neutron image detector using a superconducting tunnel junction device to detect the incident position of neutrons by means of a phonon detector device of a calorimeter type with the intermediary of phonons generated from a $^{10}B$ enriched isotopic superconductor as a neutron detection plate.

The fifteenth example of the invention as it relates to a 2D neutron image detector is described below with reference to FIG. 15. This example is the same as Example 9, except that a calorimeter device is used as the phonon sensor. The calorimeter device is a transition edge (TES) device using a tungsten superconductor. The device is a sensor capable of highly sensitive detection of temperature elevations due to phonon signals through measurement of changes in resistance. The above-described design enables the fabrication of a neutron image detector using a superconducting tunnel junction device.

What is claimed is:

1. A neutron detector using a superconducting tunnel junction device which, taking advantage of the isotopic effect of a boron (B) containing superconductor which provides the superconductor with different energy gaps, has a five-layered structure comprising in the order written an isotopic superconductor enriched in $^{10}$B of wide energy gap, an isotopic superconductor enriched in $^{11}$B of small energy gap, an insulation layer, an isotopic superconductor enriched in $^{11}$B of narrow energy gap and an isotopic superconductor enriched in $^{10}$B of wide energy gap.

2. A neutron detector using a superconducting tunnel junction device which, taking advantage of the isotopic effect of a boron (B) containing superconductor which provides the superconductor with different energy gaps, has a four-layered structure comprising in the order written an isotopic superconductor enriched in $^{10}$B of wide energy gap, an isotopic superconductor enriched in $^{11}$B of small energy gap, an insulation layer and an isotopic superconductor enriched in $^{11}$B of narrow energy gap.

3. A neutron detector using a superconducting tunnel junction device which, taking advantage of the isotopic effect of a boron (B) containing superconductor which provides the superconductor with different energy gaps, has a three-layered structure comprising in the order written an isotopic superconductor enriched in $^{10}$B of wide energy gap, an insulation layer and an isotopic superconductor enriched in $^{11}$B of small energy gap.

4. A photon, radiation or neutron detector using a superconducting tunnel junction device which, taking advantage of the isotopic effect of a boron (B) containing superconductor which provides the superconductor with different energy gaps, has a three-layered structure comprising in the order written a gradient superconductor with a gradual compositional transition in the direction of thickness from an isotopic superconductor enriched in $^{10}$B of wide energy gap to an isotopic superconductor enriched in $^{11}$B of narrow energy gap, an insulation layer and a gradient superconductor with a gradual compositional transition in the direction of thickness from an isotopic superconductor enriched in $^{11}$B of narrow energy gap to an isotopic superconductor enriched in $^{10}$B of wide energy gap.

5. A photon, radiation or neutron image detector using a superconducting tunnel junction device which, taking advantage of the isotopic effect of a boron (B) containing superconductor which provides the superconductor with different energy gaps, has a three-layered structure comprising in the order written a gradient superconductor serving as a detection plate with a gradual compositional transition in a two-dimensional plane from an isotopic superconductor enriched in $^{10}$B of wide energy gap to an isotopic superconductor enriched in $^{11}$B of narrow energy gap, an insulation layer and a gradient superconductor with a gradual compositional transition in a two-dimensional plane from an isotopic superconductor enriched in $^{10}$B of wide energy gap to an isotopic superconductor enriched in $^{11}$B of narrow energy gap, said image detector performing image detection by taking advantage of the fact that the pulse wave height to be outputted varies with the incident position of photons, radiations or neutrons.

6. A photon, radiation or neutron image detector using a superconducting tunnel junction device which, taking advantage of the isotopic effect of a boron (B) containing superconductor which provides the superconductor with different energy gaps, has a five-layered structure comprising in the order written an isotopic superconductor serving as a detection plate which is enriched in $^{10}$B of wide energy gap, a gradient superconductor serving as a quasiparticle trapping layer with a gradual compositional transition in a two-dimensional plane from an isotopic superconductor enriched in $^{10}$B of wide energy gap to an isotopic superconductor enriched in $^{11}$B of narrow energy gap, an insulation layer, a gradient superconductor serving as a quasiparticle trapping layer with a gradual compositional transition in a two-dimensional plane from an isotopic superconductor enriched in $^{10}$B of wide energy gap to an isotopic superconductor enriched in $^{11}$B of narrow energy gap, and an isotopic superconductor serving as a detection plate which is enriched in $^{10}$B of wide energy gap, said image detector performing image detection by taking advantage of the fact that the pulse wave height to be outputted varies with the incident position of photons, radiations or neutrons.

7. A radiation image detector using a superconducting tunnel junction device which, taking advantage of the isotopic effect providing two superconductors with different energy gaps, uses an isotopic superconductor of wide energy gap as a detection plate, said detection plate being provided with at least two phonon sensors each comprising an insulation layer overlaid with an isotopic superconductor of narrow energy gap in order to detect phonons as they are generated upon incidence of a radiation, either the intensity or propagation time of a signal from each of said phonon sensors or both such signal intensity and propagation time being used to detect the incident position of photons or a radiation.

8. A neutron image detector using a superconducting tunnel junction device which, taking advantage of the isotopic effect of a boron (B) containing superconductor which provides two superconductors with different energy gaps, uses an isotopic superconductor enriched in $^{10}$B of wide energy gap as a neutron detection plate, said detection plate being provided with at least two phonon sensors each comprising an insulation layer overlaid with an isotopic superconductor enriched in $^{11}$B of narrow energy gap in order to detect phonons resulting from the generation of α-rays which occurs upon incidence of neutrons, either the intensity or propagation time of a signal from each of said phonon sensors or both such signal intensity and propagation time being used to detect the incident position of neutrons.

9. The neutron image detector according to claim 8 which uses a bolometer device as the phonon sensor.

10. The neutron image detector according to claim 8 which uses a calorimeter device as the phonon sensor.

11. A neutron image detector using a superconducting tunnel junction device which, taking advantage of the isotopic effect of a boron (B) containing superconductor which provides two superconductors with different energy gaps, uses an isotopic superconductor enriched in $^{10}$B of wide energy gap as a neutron detection plate, said detection plate being provided with at least two phonon sensors each comprising in the order written an isotopic superconductor enriched in $^{11}$B of narrow energy gap, an insulation layer and an isotopic superconductor enriched in $^{11}$B of narrow energy gap in order to detect phonons resulting from the generation of α-rays which occurs upon incidence of neutrons, either the intensity or propagation time of a signal from each of said phonon sensors or both such signal intensity and propagation time being used to detect the incident position of neutrons.

12. The neutron image detector according to claim 11 which uses a bolometer device as the phonon sensor.

13. The neutron image detector according to claim 11 which uses a calorimeter device as the phonon sensor.

14. A neutron image detector using a superconducting tunnel junction device which uses a $^{10}$B enriched isotopic superconductor as a neutron detection plate, said detection plate being provided with at least two phonon sensors each comprising in the order written a metal superconductor, an insulation layer and a metal superconductor or a metal superconductor of wide energy gap provided with a quasi-particle trapping layer, a metal superconductor of narrow energy gap, an insulation layer, a metal superconductor of narrow energy gap and a metal superconductor of wide energy gap in order to detect phonons resulting from the generation of α-rays which occurs upon incidence of neutrons, either the intensity or propagation time of a signal from each of said phonon sensors or both such signal intensity and propagation time being used to detect the incident position of neutrons.

15. The neutron image detector according to claim 14 which uses a bolometer device as the phonon sensor.

16. The neutron image detector according to claim 14 which uses a calorimeter device as the phonon sensor.

17. A neutron image detector using a superconducting tunnel junction device which uses a $^{10}$B containing single crystal as a neutron detection plate, said detection plate being provided with at least two phonon sensors each comprising in the order written a metal superconductor, an insulation layer and a metal superconductor or a metal superconductor of wide energy gap provided with a quasi-particle trapping layer, a metal superconductor of narrow energy gap, an insulation layer, a metal superconductor of narrow energy gap and a metal superconductor of wide energy gap in order to detect phonons resulting from the generation of α-rays which occurs upon incidence of neutrons, either the intensity or propagation time of a signal from each of said phonon sensors or both such signal intensity and propagation time being used to detect the incident position of neutrons.

18. The neutron image detector according to claim 17 which uses a bolometer device as the phonon sensor.

19. The neutron image detector according to claim 17 which uses a calorimeter device as the phonon sensor.

20. A fast neutron image detector using a superconducting tunnel junction device which uses a hydrogen (H) containing material as a neutron detection plate, said detection plate being provided with at least two phonon sensors each comprising in the order written a metal superconductor, an insulation layer and a metal superconductor or a metal superconductor of wide energy gap provided with a quasi-particle trapping layer, a metal superconductor of narrow energy gap, an insulation layer, a metal superconductor of narrow energy gap and a metal superconductor of wide energy gap in order to detect phonons resulting from the generation of protons (p) which occurs upon incidence of neutrons, either the intensity or propagation time of a signal from each of said phonon sensors or both such signal intensity and propagation time being used to detect the incident position of fast neutrons.

21. The neutron image detector according to claim 20 which uses a bolometer device as the phonon sensor.

22. The neutron image detector according to claim 20 which uses a calorimeter device as the phonon sensor.

* * * * *

UNITED STATES PATENT AND TRADEMARK OFFICE
CERTIFICATE OF CORRECTION

| | | |
|---|---|---|
| PATENT NO. | : 7,030,379 B2 | Page 1 of 1 |
| APPLICATION NO. | : 11/013433 | |
| DATED | : April 18, 2006 | |
| INVENTOR(S) | : Masaki Katagiri et al. | |

It is certified that error appears in the above-identified patent and that said Letters Patent is hereby corrected as shown below:

On the second cover page, References Cited section (56):
In the first column, fourth reference, please replace "a Particles" with --α-Particles--

Signed and Sealed this

Twelfth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 7,030,379 B2 Page 1 of 1
APPLICATION NO. : 11/013433
DATED : April 18, 2006
INVENTOR(S) : Masaki Katagiri et al.

It is certified that error appears in the above-identified patent and that said Letters Patent is hereby corrected as shown below:

On the cover page, Assignee section (73):
 Please insert the following Assignee: -- National Institute of Advanced Industrial Science and Technology, Tokyo, Japan --

Signed and Sealed this

Sixteenth Day of September, 2008

JON W. DUDAS
*Director of the United States Patent and Trademark Office*